United States Patent [19]

Hobson et al.

[11] Patent Number: 5,527,425
[45] Date of Patent: Jun. 18, 1996

[54] METHOD OF MAKING IN-CONTAINING III/V SEMICONDUCTOR DEVICES

[75] Inventors: William S. Hobson, Summit; John Lopata, North Plainfield; Fan Ren, Warren, all of N.J.

[73] Assignee: AT&T Corp., Murray Hill, N.J.

[21] Appl. No.: 505,047

[22] Filed: Jul. 21, 1995

[51] Int. Cl.$^6$ .................................................. H01L 21/20
[52] U.S. Cl. ....................................... 156/643.1; 437/129
[58] Field of Search ..................... 156/643.1; 437/129, 437/133

[56] References Cited

U.S. PATENT DOCUMENTS

| 4,547,261 | 10/1985 | Maa et al. | 156/643.1 |
| 5,350,488 | 9/1994 | Webb | 156/643.1 |

FOREIGN PATENT DOCUMENTS

| 63-136526 | 6/1988 | Japan . |
| 2-084721 | 3/1990 | Japan . |
| 64968 | 3/1991 | Japan . |
| 49220 | 3/1991 | Japan . |
| 5-251401 | 9/1993 | Japan . |
| 6-069236 | 3/1994 | Japan . |

OTHER PUBLICATIONS

W. F. Marx et al., "Electron cyclotron resonance etching of aluminum alloys with $BCl_3$—$Cl_2$—$N_2$," Journal of Vacuum Science and Technology A, vol. 10, No. 4, pt. 1, pp. 1232–1237, Jul.–Aug. 1992.

"Reactive Ion Etching of Copper with $BCl_3$ and $SiCl_4$: Plasma Diagnostics and Patterning", by B. J. Howard et al., J. Vac. Sci. Technol. A, vol. 12(4), Jul./Aug. 1994, pp. 1259–1264.

"Electron Cycloton Resonance Etching of Aluminum Alloys with $BCl_3$—$Cl_2$—$N_2$", by W. F. Marx et al., J. Vac. Sci. Technol. A, vol. 10(4), Jul./Aug. 1992, pp. 1232–1237.

"Fabrication of Self–aligned GaAs/AlGaAs and GaAs/InGaP Microwave Power Heterojunction Bipolar Transistors", by F. Ren et al., J. Vac. Sci. Technol. B, vol. 12(5), Sep./Oct. 1994, pp. 2916–2928.

Primary Examiner—R. Bruce Breneman
Assistant Examiner—Linda J. Fleck
Attorney, Agent, or Firm—Eugen E. Pacher

[57] ABSTRACT

In-containing III/V semiconductor materials (e.g., InGaP) can be dry etched in $BCl_3$ in ECR apparatus. We have discovered that addition of $N_2$ to the $BCl_3$ can result in substantially higher etch rate (e.g., more than 50% higher). Etching is substantially without incubation period, and the resulting surface can be very smooth (e.g., RMS roughness less than 5 nm, even less than 2.5 nm). Exemplarily, the novel etching step is used in the manufacture of a InGaP/GaAs transistor.

8 Claims, 3 Drawing Sheets

METHOD OF MAKING IN-CONTAINING III/V SEMICONDUCTOR DEVICES

FIELD OF THE INVENTION

This invention pertains to methods of making In-containing III/V semiconductor devices, exemplarily semiconductor lasers and transistors.

BACKGROUND OF THE INVENTION

It is known that the In-containing III/V semiconductor heterostructure systems (e.g., InGaP/GaAs, InGaAs/InP) can have advantages over the Al-containing system (e.g., AlGaAs/GaAs). Among these advantages are lower susceptibility to oxidation as well as an apparent lower density of deep level states. Thus there exists a need for development of processing methods for In-containing III/V semiconductor devices.

The remainder of the discussion will be largely in terms of a particular In-containing semiconductor material, namely, InGaP. This is done for reason of conciseness and does not imply that the inventive method is thus limited.

InGaP can be selectively wet etched in HCl-based solutions, and selective dry etching of InGaP over GaAs is possible in $CH_4/H_2$ discharges. However, not only is the etch rate of the prior art dry etching method very low (typically <10 nm/min), but the method typically results in extensive hydrogen passivation in exposed III/V material, requiring annealing to re-activate dopants. Faster etch rates can be obtained with Cl-based plasmas, but at temperatures below about 150° C. the resulting surface generally is rough, and typically unsuitable for further processing. Dry etching at higher temperatures may result in smoother surfaces but is not desirable because of substantial incompatibility with other process steps, and the limitation for using conventional resist masks.

In view of the potential advantages of at least some In-containing III/V semiconductor devices, it would be of considerable interest to have available a method of dry etching In-containing III/V semiconductor material that can produce smooth, substantially damage-free surfaces, can yield high etch rates substantially without incubation period, and does not require high sample temperature. This application discloses such a method.

Dry etching of metals in $BCl_3$-based plasmas is known. For instance, B. J. Howard et al., *J. Vacuum Science and Technology*, Vol. 12 (4), Part 1, p. 1259 (1994), report etching of Cu in $BCl_3/N_2$ as well as in $BCl_3/Ar$. At 225°–275° C. the Cu etch rate in the former plasma was found to be as much as an order of magnitude larger than in the latter. They report that $N_2$ does not merely act as a diluent but rather increases the concentration of Cl atoms.

By way of further examples, W. F. Marx et al., *J. Vacuum Science and Technology*, Vol. 10 (4), Part 1, p. 1232 (1992), report electron cyclotron resonance (ECR) etching of Al alloys with $BCl_3/Cl_2/N_2$. Japanese patent application Publication No. 06-069236, Mar. 11, 1994 reports etching of an Al/Ti/amorphous Si film in a $BCl_3/Cl_2/N_2$ plasma, and Japanese patent application Publication No. 05-251401, Sep. 28, 1993 reports etching TiW in a $BCl_3/SF_6/N_2$ plasma. Japanese patent application Publication No. 02-084721, Mar. 26, 1990 discloses forming a trench in Si by dry etching with $BCl_3$ and $N_2$ at 10 mTorr and −250 V, and Japanese patent application Publication No. 63-136526, Jun. 8, 1988 discloses forming a tapered via hole through a GaAs body by reactive ion etching in $BCl_3/Cl_2/N_2$ at 1.7 Pa, with $N_2$ addition resulting in reversal of the taper of the via hole.

THE INVENTION

Figure 1:
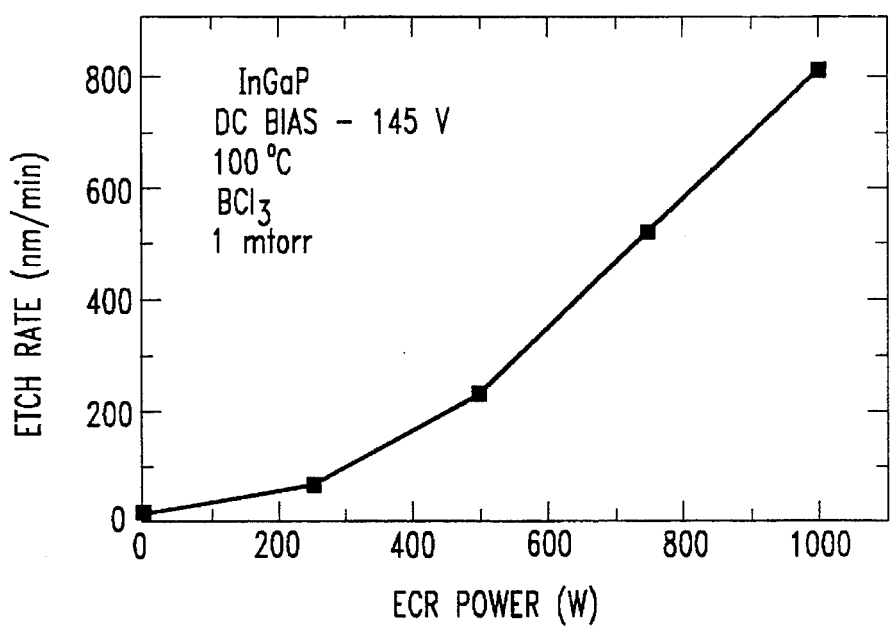
FIGS. 1 and 4 show exemplary data on etch rate vs. microwave power.

The invention is embodied in an improved method of making semiconductor electronic devices (e.g., lasers, HBTs or HEMTs) that comprise In-containing III/V semiconductor material (e.g., InGaP, InP, InAlP). The method comprises providing a semiconductor body (typically a wafer) that comprises the In-containing material, and placing the body into a reactor, typically a ECR (electron cyclotron resonance) reactor. Such reactors are known, and are commercially available. The method further comprises flowing gas into the reactor, and applying microwave power to the gas in the reactor such that a plasma is formed in the reactor. The body is exposed to the plasma such that at least some of the In-containing material is removed from the body.

Significantly, the gas that is flowed into the reactor comprises $N_2$ and $BCl_3$. Optionally the gas may also comprise other constituents, e.g., an inert gas such as Ar. The $N_2/BCl_3$ ratio is selected such that the plasma is effective for removing the In-containing material at a first etch rate that is at least 50% larger than a second etch rate. The second etch rate is the rate of removal of the In-containing material in the same reactor, under the same conditions (e.g., same microwave power, DC bias, sample temperature, process pressure) except that the $N_2/BCl_3$ ratio is zero.

Embodiments of the invention utilize our unexpected discovery that the etch rate of In-containing III/V semiconductor material can be substantially higher in a $N_2$- and $BCl_3$-containing plasma than in the corresponding $N_2$-free plasma. We have also discovered that $N_2$-addition not only can increase the etch rate substantially without incubation period but also can result in a substantially smooth etched surface.

Our experiments were carried out in a load-locked PLASMA THERM SL 770 ECR (electron cyclotron resonance) plasma reactor, utilizing an ASTEX 440 microwave source and separate RF (13.56 MHz) biasing of the sample position. We expect that the results we obtained are to some extent apparatus-dependent, but also expect that different ECR plasma etchers will yield results that are qualitatively the same and quantitatively similar to our results.

In-containing III/V semiconductor material (e.g., InGaP, InAlP) was epitaxially grown on GaAs substrates by a conventional technique. The substrates were cut 2° off (100) towards [110], and were semi-insulating. For dry etching the samples were patterned with conventional photoresist or 300 nm $SiO_2$ layers, opened with $SF_6/Ar$ plasma etching.

The samples were clamped to a temperature-controlled cathode, with sample temperatures typically in the range 40°–300° C. Electronic grade gases ($BCl_3$, $N_2$, Ar, O) were metered into the ECR source through conventional mass flow controllers in accordance with experimental requirements. Process pressure typically was 1 mTorr. Etch rates were determined using a conventional stylus profilometer, and surface roughness was measured using a 7×7 μm² scanning area for atomic force microscopy, using a BURLEIGH ARIS-300 system. All of the above referred to apparatus is known to those skilled in the art, and is commercially available.

FIG. 1 shows the etch rate of InGaP in $BCl_3$ as a function of microwave power at 100° C. The data shows that at relatively high microwave powers (e.g., ≧500 W) the etch rate of this exemplary In-containing semiconductor material is reasonably high (e.g., ≧200 nm/min), generally higher than under conventional reactive ion etching conditions. Furthermore, for relatively high microwave powers the etched surface of the In-containing III/V semiconductor is relatively smooth, as is exemplified by FIG. 2, which shows RMS (root mean square) surface roughness of a InGaP surface ECR etched in $BCl_3$ at 100° C., with −145 V dc bias.

Figure 2:
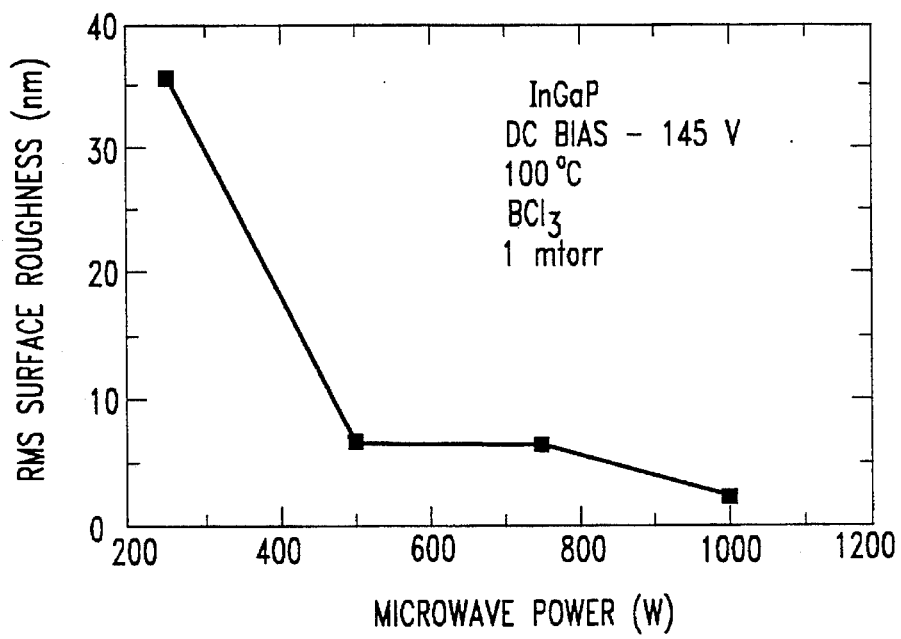
FIG. 2 shows exemplary data on surface roughness vs. microwave power.
Figure 3:
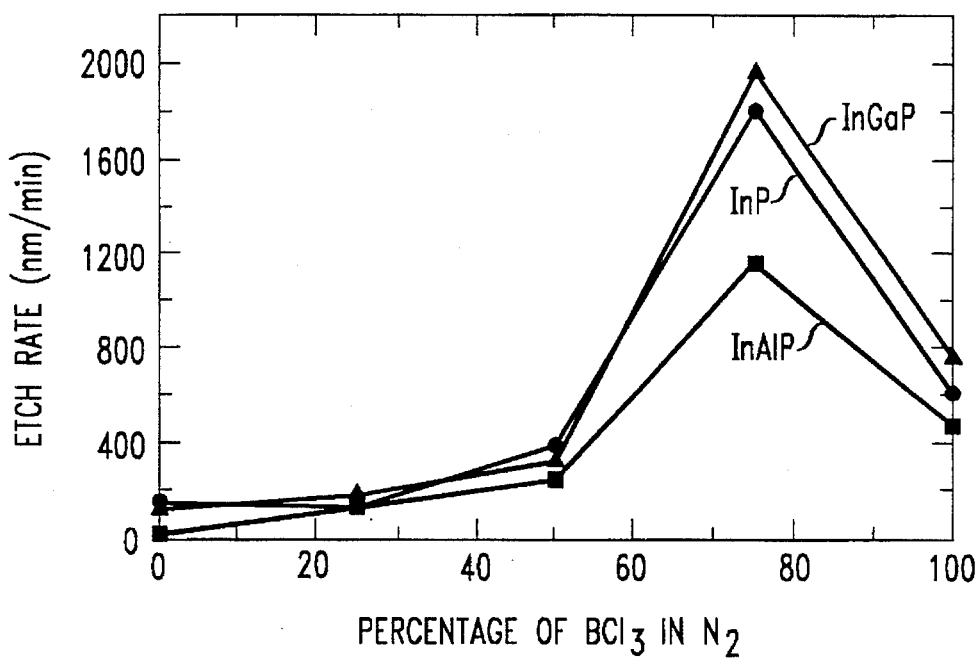
FIGS. 3 and 5 show exemplary data on etch rate vs. gas composition.

FIG. 3 shows etch rate as a function of the $N_2/BCl_3$ ratio of the gas provided to the ECR reactor, at fixed temperature (100° C.), microwave power (1000 W), DC bias (−145 V) and process pressure (1 mTorr), for InAlP, InP and InGaP. As can be seen from FIG. 3, addition of $N_2$ to the processing gas results in significant increase in the etch rates for all three of the exemplary In-containing III/V semiconductors. Significant increases (e.g., >20%, preferably >50%) were observed when the $N_2$ content was in the approximate range 5–45% (corresponding to $N_2/BCl_3$ in the approximate range 0.05–0.82), with a maximum typically occurring at about 25% $N_2$. The increase in etch rate was achieved without significant increase in surface roughness, which remained substantially as shown in FIG. 2.

Figure 4:
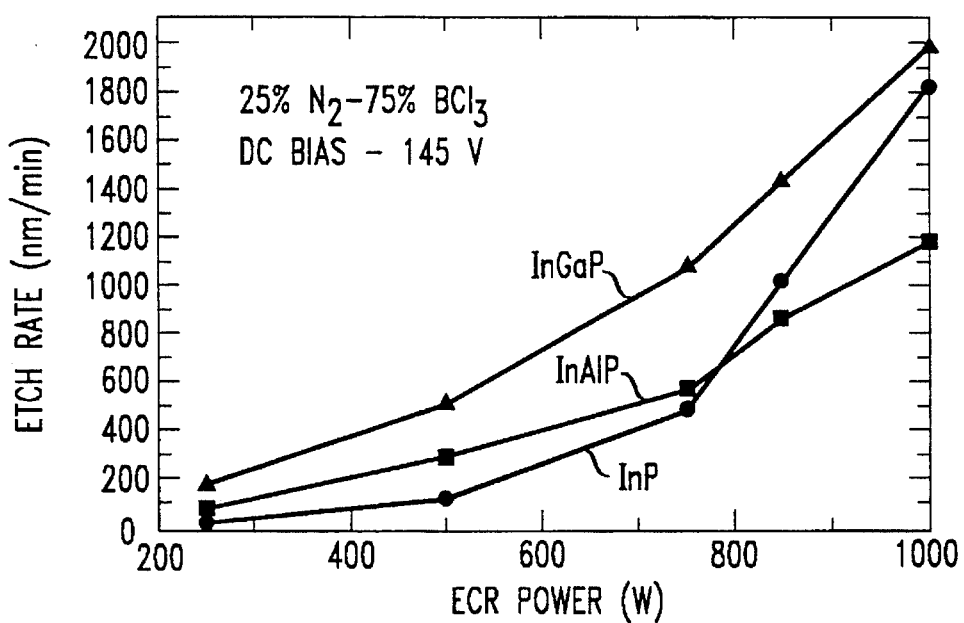

FIG. 4 shows data on etch rate vs. microwave power, at 1:3 $N_2/BCl_3$ ratio, corresponding approximately to the optimal ratio in our apparatus. As can be seen, the etch rates depend on microwave power, qualitatively similar to the dependence for $BCl_3$ (see FIG. 1). However, the etch rates in 1:3 $N_2/BCl_3$ increase more strongly with increasing microwave power than do the rates in $BCl_3$. In view of the observed significant increase in the etch rate for relatively high microwave powers (exemplarily ≧500 W), and the concomitant decrease of surface roughness, currently preferred embodiments of the invention utilize such relatively high microwave powers (typically ≧500 W).

Figure 5:
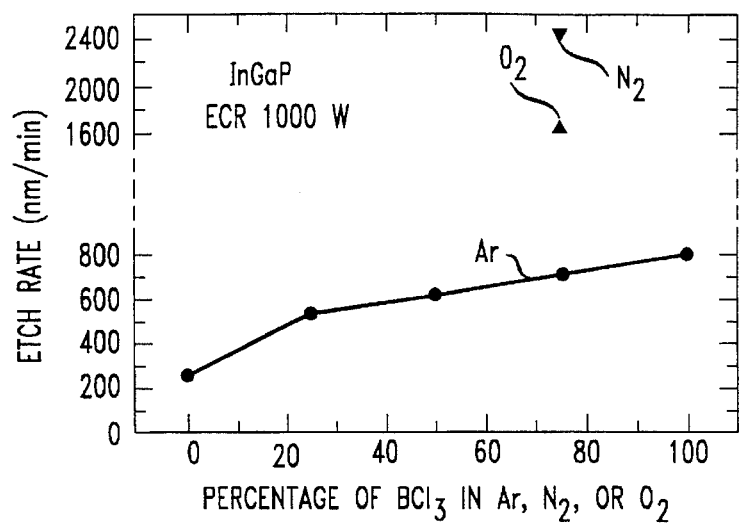

FIG. 5 provides evidence that the observed increase in the etch rate of In-containing III/V semiconductors with addition of a further gas to $BCl_3$ is most strongly observed if $N_2$ is the further gas. As FIG. 5 shows, addition of Ar has insignificant effect, addition of $O_2$ has some effect (exemplarily approximately doubling the rate at 1:3 $O_2/BCl_3$ ratio, as compared to $BCl_3$ alone), but addition of $N_2$ has by far the strongest effect, exemplarily approximately tripling the etch rate of InGaP, as compared to the rate for $BCl_3$ alone. Thus, $N_2$ is the currently preferred further gas.

Those skilled in the art will appreciate that practice of the invention requires appropriate biasing of the sample. In our apparatus this is accomplished through choice of the RF power. For instance, application of 100 W RF power in our apparatus results in a sample bias of about −145 V. Typically, it will be desirable to use relatively low (in absolute value) biasing, in order to minimize sample damage due to ion bombardment. Thus, DC bias preferably is at most 200 V, preferably less than 150 V, in absolute value. Under our experimental conditions there was little dependence of the etch rate on processing pressure or flow rate at fixed microwave power.

Figure 6:
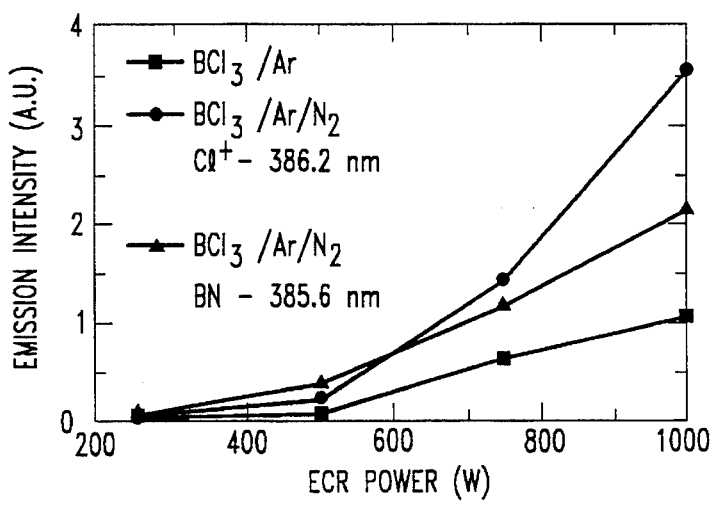
FIGS. 6 and 7 show exemplary emission intensity data vs. microwave power.
Figure 7:
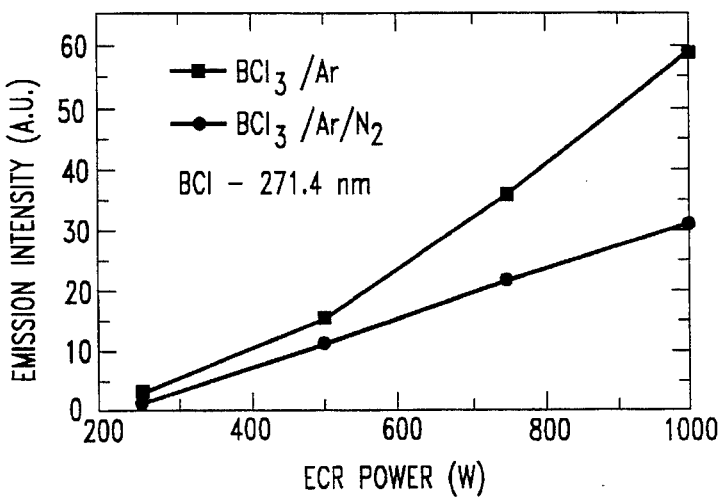

The reason for the unexpectedly advantageous effect of $N_2$ addition to the processing atmosphere is not fully understood at present, but is possibly related to a resultant increase in the active chlorine radical concentration. This interpretation is in accord with the spectroscopic data of FIGS. 6 and 7. The former figure shows a large increase in the emission intensity at 386.2 nm (associated with $Cl^+$) upon addition of $N_2$ to the $BCl_3$, as well as a substantially smaller increase at 385.6 nm (associated with BN formation). The latter figure shows that the emission at 271.4 nm (associated with BCl) is lowered by addition of $N_2$. It will be understood that these emission intensities are indicative of the concentrations of the corresponding chemical species in the plasma. The increased concentration of active chlorine radicals in the nitrogen-containing plasma is likely to result in additional reaction between $BCl_3$ and $N_2$ while $BCl_x$ bonds to N and releases more chlorine ions and free radicals, resulting in increased etch rates.

The above discussion of a possible mechanism is for tutorial purposes only, and is not intended to limit the invention to any particular mechanism.

The invention is advantageously utilized in the manufacture of In-containing III/V semiconductor devices such as GaAs- or InP-based heterojunction bipolar transistors (HBTs), high electron mobility transistors (HEMTs), and lasers. All these devices can be made by conventional methods, except that the method according to the invention is used in one or more steps of etching In-containing III/V semiconductor material.

In an exemplary embodiment, the inventive method is used to manufacture a self-aligned InGaP/GaAs microwave power HBT of the type described by F. Ren et al., *Journal of Vacuum Science and Technology B*, Vol. 12 (5), p. 2916 (September/October 1994), incorporated herein by reference. Manufacture can be substantially as described in the reference, except that InGaP is etched according to the invention. Exemplarily, $BCl_3$ and $N_2$ are metered into the ECR reactor to yield 1 mTorr working pressure, with 1:3 molecular $N_2/BCl_3$ ratio. Addition of other gases (e.g., Ar) is optional. The sample is biased at ≦145 V (absolute value), maintained at about 100° C., and 1000 W microwave power is applied. The etch rate is more than 50% larger than the comparison etch rate ($BCl_3$ only, all else being equal). Substantially no incubation period is observed, and the resulting etched surface is highly smooth, with RMS roughness less than 5 nm, typically less than about 2.5 nm.

The invention claimed is:

1. Method of making a semiconductor device that comprises In-containing III/V semiconductor material, the method comprising a) providing a semiconductor body that comprises said In-containing III/V semiconductor material, and placing the body into a reactor chamber;

b) flowing gas into the reactor chamber and applying microwave power to the gas such that a plasma is formed in the reactor, said body being exposed to the plasma such that at least some of the In-containing III/V semiconductor material is removed from the body;

CHARACTERIZED IN THAT c) said gas contains $N_2$ and $BCl_3$, with the $N_2/BCl_3$ ratio selected such that the plasma is effective for removing said In-containing III/V semiconductor material at an etch rate that is at least 50% larger than a comparison etch rate, where said comparison etch rate is the rate of removal of the In-containing III/V semiconductor material when the $N_2/BCl_3$ ratio is zero, all else being equal.

2. Method of claim 1, wherein said gas consists essentially of $N_2$ and $BCl_3$, with the $N_2/BCl_3$ ratio in the range 0.05–0.82.

3. Method of claim 2, wherein the $N_2/BCl_3$ ratio is about 1/3.

4. Method of claim 1, wherein said microwave power is at least 500 W.

5. Method of claim 1, wherein said In-containing semiconductor material is selected from the group consisting of InP, InGaP, InGaAs, InAlP, and InGaAsP.

6. Method of claim 1, wherein a surface from which said In-containing III/v semiconductor material is removed has a root mean square roughness of at most 5 nm.

7. Method of claim 1, further comprising applying a DC bias to the semiconductor body, said DC bias being at most 200 V in absolute value.

8. Method of claim 1, wherein the semiconductor device is a laser or a transistor.

* * * * *